United States Patent [19]

Nakamura

[11] Patent Number: 5,680,406
[45] Date of Patent: Oct. 21, 1997

[54] INTEGRATED SEMICONDUCTOR CIRCUIT HAVING SCAN FLIP-FLOPS AT PREDETERMINED INTERVALS AND TESTING METHOD THEREOF

[75] Inventor: Yoshiyuki Nakamura, Tokyo, Japan

[73] Assignee: NEC Corporation, Tokyo, Japan

[21] Appl. No.: 291,476

[22] Filed: Aug. 17, 1994

[30] Foreign Application Priority Data

Jul. 2, 1993 [JP] Japan ................... 5-240317

[51] Int. Cl.⁶ ............................................... G01R 31/28
[52] U.S. Cl. .................................................. 371/22.1
[58] Field of Search ........................... 371/22.1, 22.5, 371/22.6, 25.1; 324/73.1, 500, 763, 158.1

[56] References Cited

U.S. PATENT DOCUMENTS

| | | | |
|---|---|---|---|
| 4,864,579 | 9/1989 | Kishida et al. | 371/22.3 |
| 4,995,039 | 2/1991 | Sakashita et al. | 371/22.3 |
| 5,109,190 | 4/1992 | Sakashita et al. | 324/158 R |
| 5,130,647 | 7/1992 | Sakashita et al. | 324/158 R |
| 5,254,942 | 10/1993 | D'Souza et al. | 324/158 R |
| 5,341,096 | 8/1994 | Yamamura | 324/765 |

FOREIGN PATENT DOCUMENTS

61-193083  2/1985  Japan.

*Primary Examiner*—Robert W. Beausoliel, Jr.
*Assistant Examiner*—Stephen C. Elmore
*Attorney, Agent, or Firm*—Whitham, Curtis, Whitham & McGinn

[57] ABSTRACT

An integrated semiconductor circuit and a testing method thereof to achieve a reduced chip area and a shorter test time. In the circuit, scan flip-flops occur at regular intervals. In the exemplary case, supposing a third flip-flop is defective and constantly outputs a 0, firstly a data value 1 is scanned into a second flip-flop, and then under a normal operation mode the data of the second flip-flop is transmitted to the third, before a scan-out action thereof, which permits the detect of the third flip-flop to be detected. When supposing a fifth flip-flop is similarly defective, a first scan-in action is performed to input a data value 1 to a second and a fourth flip-flop, and the data are transmitted to the third and the fifth flip-flop. Then, a second scan-in is performed to input 0 to the fifth flip-flop, before a scan-out action of data, which permits the trouble of the fifth flip-flop to be detected.

13 Claims, 8 Drawing Sheets

INTEGRATED SEMICONDUCTOR CIRCUIT HAVING SCAN FLIP-FLOPS AT PREDETERMINED INTERVALS AND TESTING METHOD THEREOF

BACKGROUND OF THE INVENTION

The present invention relates to an integrated semiconductor circuit and a testing method thereof, and particularly to an integrated semiconductor circuit including a sequential circuit and a combinational circuit and a testing method thereof.

DESCRIPTION OF THE RELATED ART

Conventionally, it was difficult to test a large scale integrated logic circuit that had an internal sequential circuit. Various circuit systems have therefore been proposed to permit a facilitated test. Widely employed is an integrated logic circuit of which the sequential circuit has a set of flip-flops (hereinafter sometimes called "FF") permitting a direct setting of externally generated values, as a scan test system for observation of logic circuits using the same.

Figure 1:
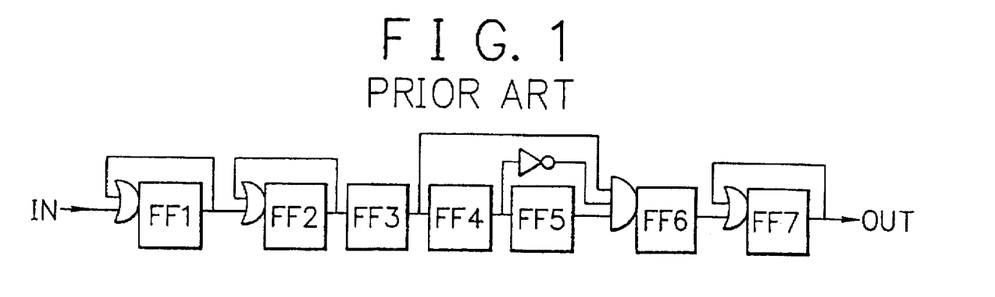
FIG. 1 is a circuit diagram showing a typical constitution of conventional integrated semiconductor circuits.
Figure 2:
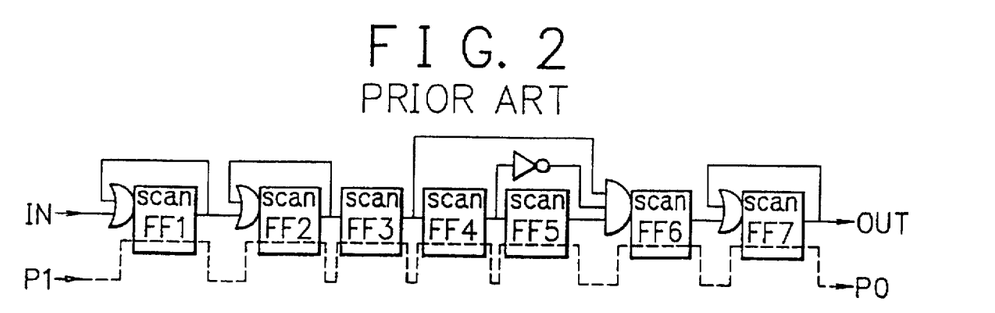
FIG. 2 shows a example of circuit constitution describing a conventional testing method of integrated semiconductor circuit.

The scan test is performed as described below. The description will be given to the case of testing a normally operable circuit shown in FIG. 1. The circuit of FIG. 1 is built in an integrated circuit designed to have reconfigured circuitry adapted for the scan test. An example of the reconfigured circuitry is shown in FIG. 2. As will be understood from comparison between FIGS. 1 and 2, all flip-flops FF1–FF7 that belong the circuit are replaced by corresponding scan flip-flops, i.e. scan FF1–scan FF7. This reconfiguration permits the circuitry to constitute corresponding shift registers for scanning the circuit in the test.

The scan test starts by setting the circuit to its scan test mode in which each FF constitutes a shift register. A set of test pattern-dependent data are scanned in at a scan input terminal PI, to input predetermined data to the scan FF1–scan FF7. Then, the circuit is reset to its normal operation mode, where it operates in accordance with scan-in data. Data resulting from the operation are scanned out from the respective FF's as again constituted shift registers, at a scan output terminal P0. Thus obtained data are then compared with expected output data, to judge whether the circuit function is good or not. Thereafter, like operation is repeated a required number of times.

Such a scan test system exhibits problems however. Firstly the scan FF's employ a greater number of transistors than ordinary FF's would, thus needing an enlarged chip area. And secondly, the scan test requires a significant length of time, causing the yield of chip production to be reduced.

As measures to overcome the second problem, there are known multi-scan systems and partial scan systems that lower the number of clocks required for a single time of scan-in or scan-out. As a definite example, a multi-scan system is proposed in the Japanese Patent Laid-Open Publication No. 61-193083, which employs a plurality of scan paths to decrease the required number of clocks for scan-in and scan-out.

Figure 3:
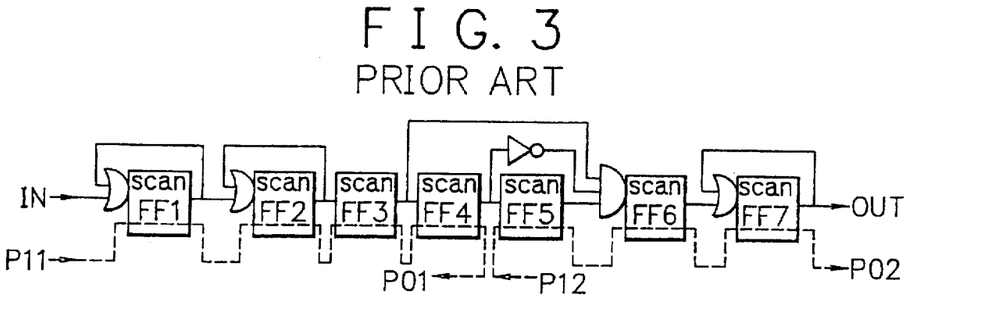
FIG. 3 shows another example of circuit constitution describing a conventional testing method of integrated semiconductor circuit.

In FIG. 2, a single scan path is provided for the seven scan FF's, requiring seven clocks at every scan-in and scan-out. In the case of FIG. 3 having a pair of separated scan paths provided with scan input terminals P11, P12 and scan output terminals P01, P02, respectively, no more than four clocks are required at every scan-in and scan-out.

Figure 4:
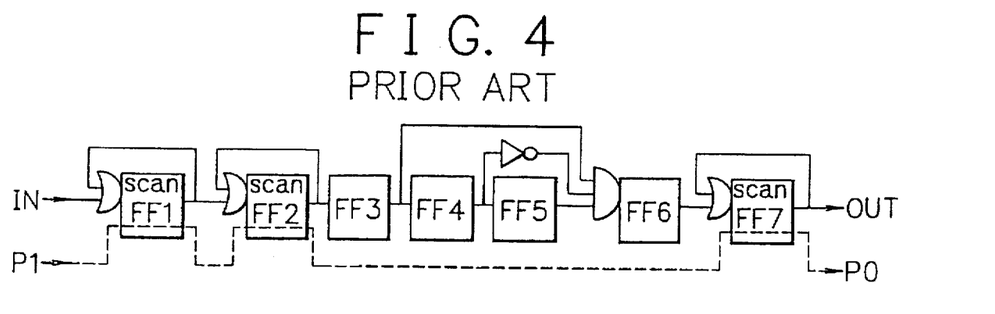
FIG. 4 shows a still another example of circuit constitution describing a conventional testing method of integrated semiconductor circuit.

In the U.S. Pat. No. 5,043,986 is disclosed a partial scan system in which, from among a set of FF's, only those that consitute feedback loops are selected to be reconfigured into scan FF's, while others are left to be used as they are. For example, in the case of the circuit shown in FIG. 1, only the flip-flops FF1, FF2 and FF7 are reconfigured to scan FF's, as shown in FIG. 4. In this case, no more than three clocks are required at every scan-in and scan-out. The partial scan system suppresses the use of scan FF's, effectively controlling the chip area that otherwise might be increased by them.

The conventional system proposed in the Japanese Patent Laid-Open Publication No. 61-193083 needs external scan-in and scan-out terminals, both plural in number, as described. It therefore is still problematic in that the external terminals, which are far greater in size than internal elements, cancel the reduction effect of chip area due to a decreased number of scan FF's, resulting in an increased chip area.

The conventional system disclosed in the U.S. Pat. No. 5,043,986 can decrease the required number of clocks at every scan-in and scan-out. It however is still problematic in that U.S. Pat. No. 5,043,986 lacks consideration of decreasing the number of times of scan-in which may adversely increase the test time in some cases. Exemplarily in FIG. 4, a trouble is now suppposed to have occurred so that FF3 fails to vary the output, constantly giving a "0". It then would be necessary for detecting the trouble to make a setting of faulty FF3 to "1", FF4 to "0" and FF5 to "1", and transmit the result of an operation thereunder to FF6, before reading to check whether or not the output value is "1". There would thus be needed the following series of steps to be taken as shown in FIGS. 5A–5E.

Figure 5A:
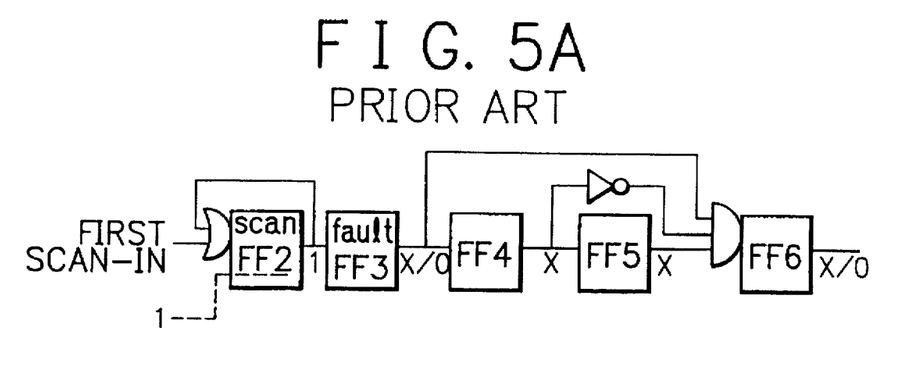
FIGS. 5A to 5E are circuit diagrams for describing steps of the testing method of FIG. 4, respectively.
Figure 5B:
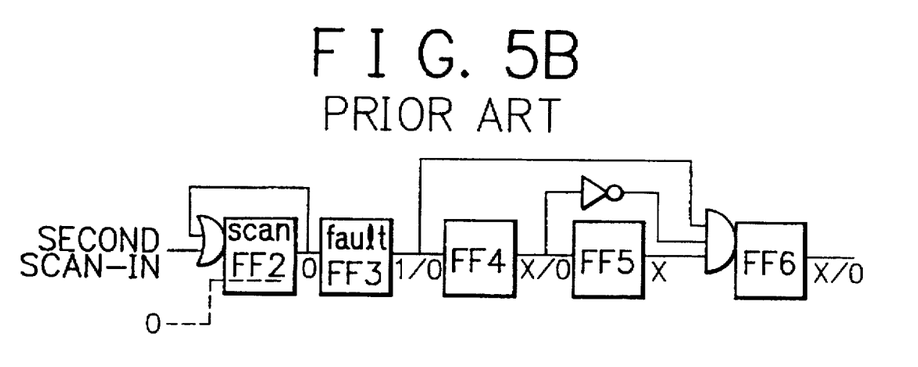
Figure 5C:
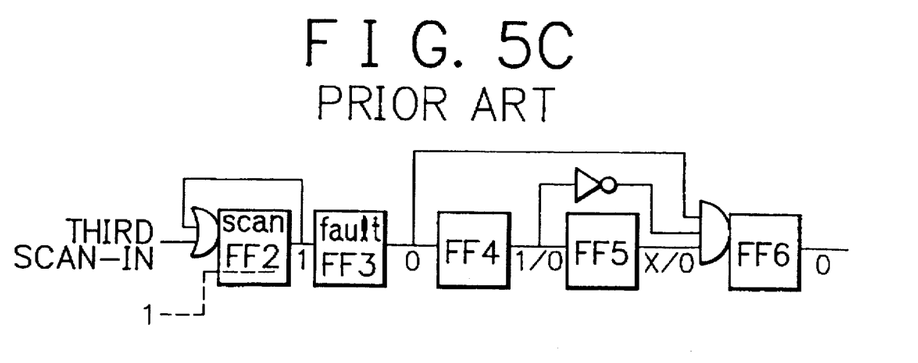

In FIG. 5A, as a first step, a first scan-in action is performed to input "1" to the scan FF2. At the next step, a normal mode is entered for data transfer from the scan FF2 to the faulty FF3. Respective states of FF3–FF6 thus obtained are shown in FIG. 5B. In FIGS. 5A–5C, each character "X" represents an undefined number.

Then, a second scan-in action is performed to input "0" to the scan FF2, as shown in FIG. 5B. At the next step, the normal mode is again entered to transfer the data value "0" of scan FF2 to the faulty FF3. Respective states of FF3–FF6 thus obtained are shown in FIG. 5C.

Figure 5D:
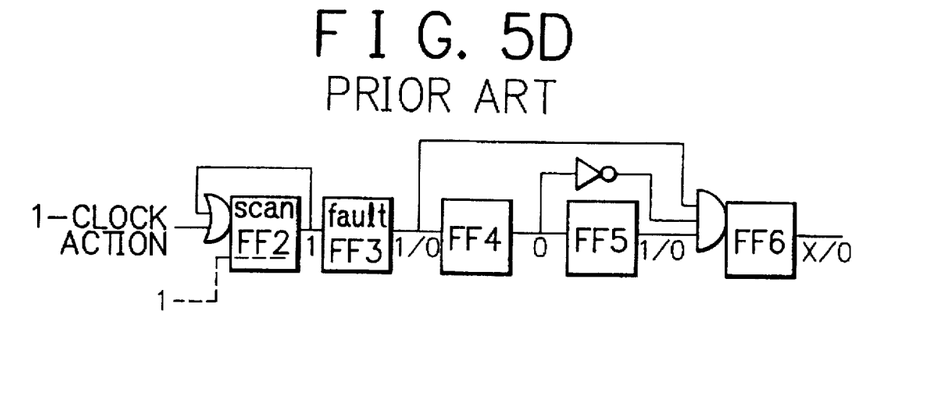
Figure 5E:
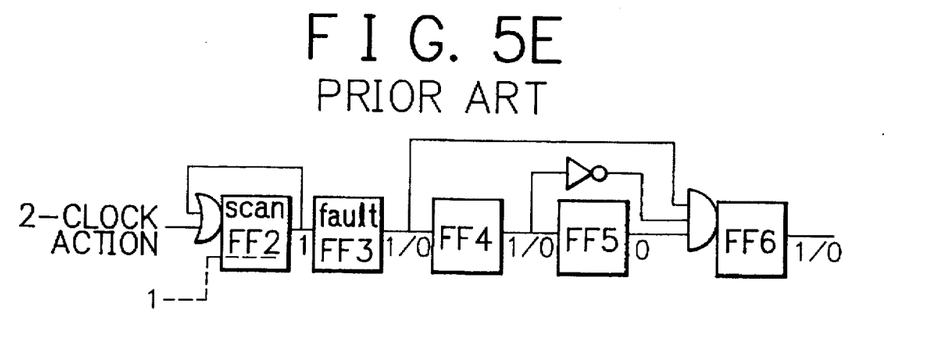

Then, a third scan-in action is performed to input "1" to the scan FF2, as shown in FIG. 5C. At the next step, the normal mode is again entered for data transfer from the scan FF2 to the faulty FF3. Respective states of FF3–FF6 thus obtained are shown in FIG. 5D.

In a subsequent step, with still another clock given, FF3–FF5 have their data AND-operated to transmit the result to FF6. Thereafter, a scan-out operation is performed to read the data of FF6.

In the exemplary case, therefore, the partial scan test system requires a scan-in action to be performed three times for the scan FF2. At each time, the scan-in action requires three clocks. As a result, 3×3=9 clocks are necessary for scan-in. The required number of clocks for scan-in is thus increased. Moreover, the test system needs a test mode and a normal operation mode repeatedly selected to be changed over therebetween, thus needing an extended test time.

SUMMARY OF THE INVENTION

It is therefore an object of the present invention to provide an integrated semiconductor circuit and a testing method thereof permitting a reduced chip area and a shorter test time.

To achieve the object, the present invention provides an integrated semiconductor circuit including a plurality of sequentially connected flip-flops and a combinational circuit consisting of at least one logic element, wherein: the flip-flops are constituted as a scan flip-flop at regular intervals; and the flip-flops are adapted to perform a scan-in action and a scan-out action in a scan test.

According to another aspect of the invention, the plurality of flip-flops may preferably be separated into a plurality of blocks each respectively provided with a scan input terminal and a scan output terminal.

Moreover, to achieve the object, the present invention provides a testing method of integrated semiconductor circuit for performing a fuctional test of an integrated semiconductor circuit including a plurality of sequentially connected flip-flops and a combinational circuit consisting of at least one logic element, in which the flip-flops are constituted as a scan flip-flop at regular intervals, comprising: a scan-in step for performing a scan-in action to the scan flip-flop; a normal operation step for executing a normal operation to the integrated semiconductor circuit with a number of clock cycles not exceeding the predetermined number; and a scan-out step for performing a scan-out action to the scan flip-flop.

According to another aspect of the invention, the testing method may preferably further comprise a repetition step for repeating the scan-in step, the normal operation step and the scan-out step a required number of times.

According to still another aspect of the invention, in a cycle of process consisting of the scan-in step, the normal operation step and the scan-out step, the scan-in step may preferably be performed a plurality of times to a single time of the scan-out step.

According to the subject matter of the invention, therefore, in an integrated semiconductor circuit, flip-flops are constituted as a scan flip-flop at every place of order counting a predetermined number thereof, and are adapted to perform a scan-in action and a scan-out action in a scan test. Further, in a testing method of an integrated semiconductor circuit so constituted, a scan-in action is performed to a scan flip-flop, and then a normal operation to the integrated semiconductor circuit is executed with a number of clock cycles not exceeding a predetermined number of flip-flops, and thereafter a scan-out action is performed to the scan flip-flop. According to such a procedure, after a scan-in action for a predetermined logic, scanned out logic data can be checked to thereby judge whether a certain flip-flop is good or not.

BRIEF DESCRIPTION OF THE DRAWINGS

The objects, features and advantages of the present invention will become more apparent from consideration of the following detailed description, taken in conjunction with the accompanying drawings, in which.

DESCRIPTION OF THE PREFERRED EMBODIMENTS

There will be detailed below preferred embodiments of the present invention, with reference to FIGS. 6 to 10.

Referring first to FIG. 6 and FIGS. 7A–7D and 8A–8D, a design procedure of an integrated semiconductor circuit according to a first embodiment of the invention will be described.

Figure 6:
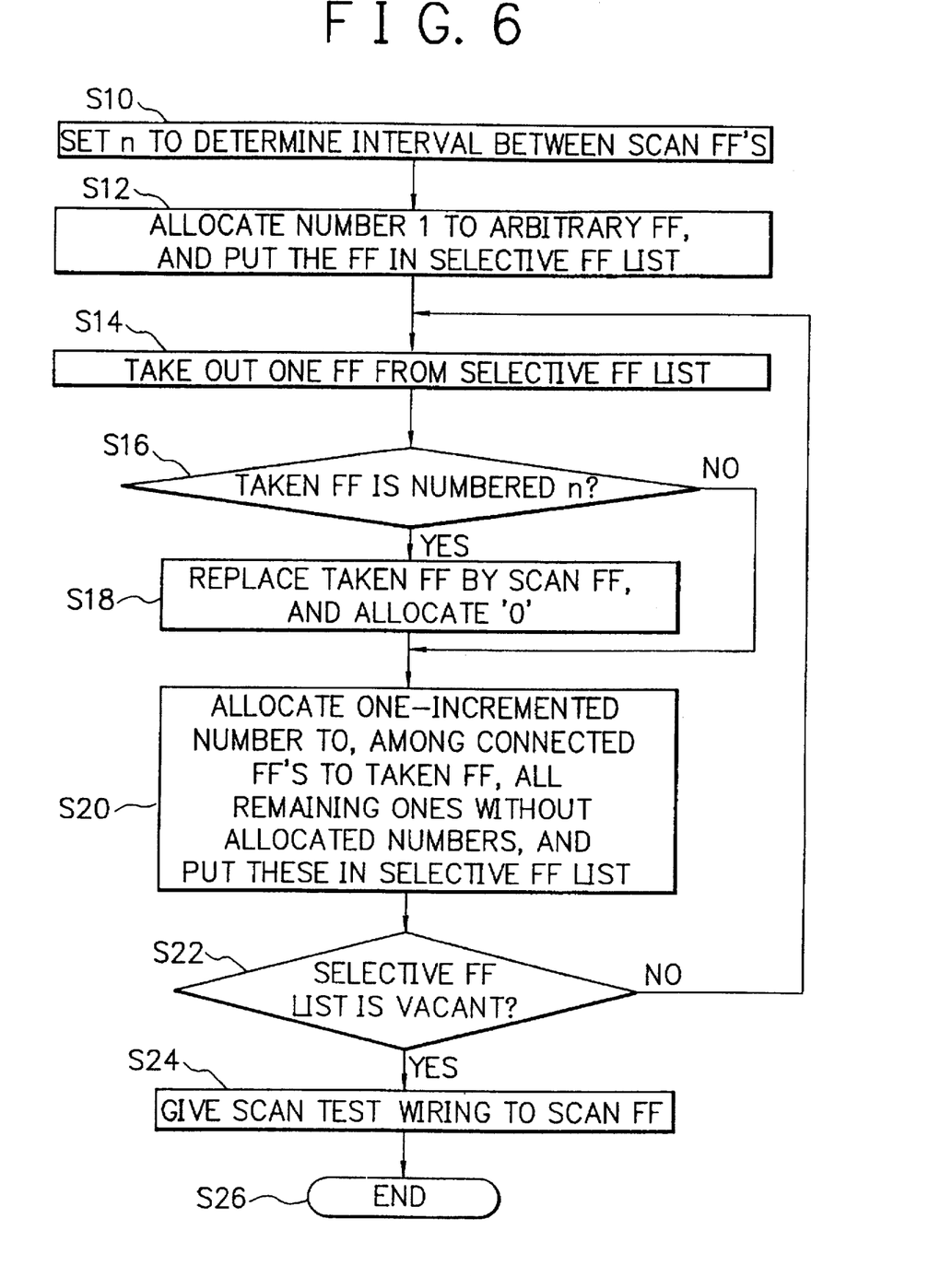
FIG. 6 is a flowchart of a design procedure of an integrated semiconductor circuit according to a first embodiment of the invention.

As shown in FIG. 6, at a first step S10 of the design procedure, a numeral n is set for a plurality of sequentially connected flip-flops, to thereby define each place of order designed to count a predetermined number of flip-flops, to reconfigure a flip-flop on that place into a scan flip-flop; i. e. to thereby determine each interval as a designed number of flip-flops to be left between replaced ones by scan FF's. In the present embodiment, the numeral n=2, i.e. the interval is designed to be 1.

Figure 7A:
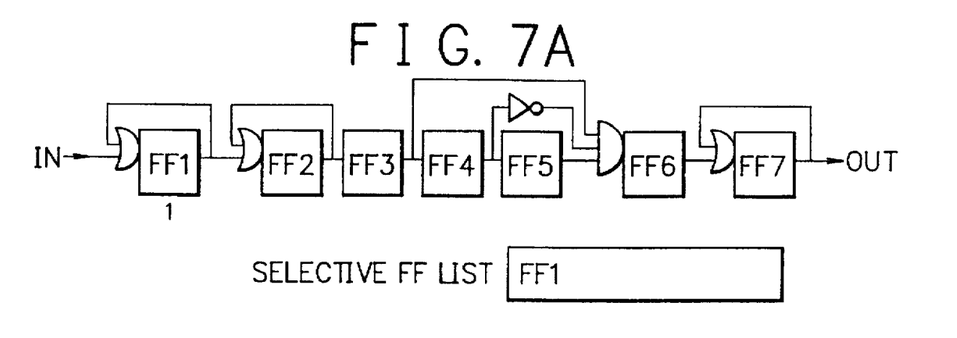
FIGS. 7A to 7D are circuit diagrams for describing a series of steps of the design procedure according to the flowchart of FIG. 6, respectively.

At a subsequent step S12, an arbitrary FF is selected. It is now supposed that FF1 is selected. The selected FF1 is labelled with an allocated number '1', and is put in a selective FF list, as shown in FIG. 7A.

Then, at a step S14, an FF (FF1 in this case) is taken out from the selective FF list, to be checked at a step S16 whether or not its allocated number is equal to n. The number of FF1 is 1, inequal to n=2, so that the result of check at the step S16 is "NO" in this case, and the flow goes to a step S20.

Figure 7B:
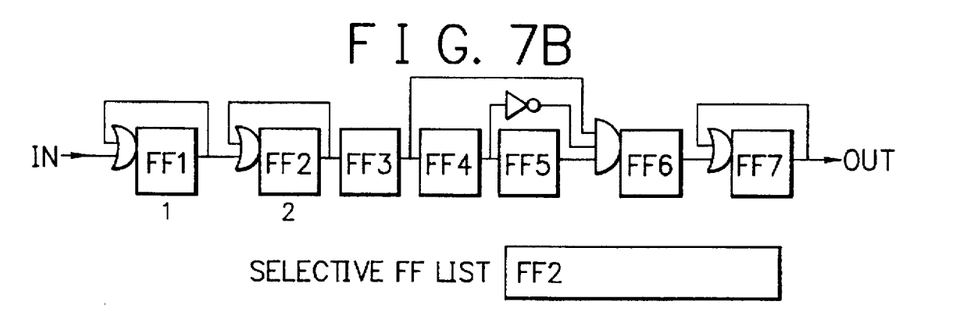

At the step S20, among connected FF's (only FF2 in this case) to the taken FF (FF1 in this case), all remaining ones (only FF2 in this case) without allocated numbers are labelled with a one-incremented number ('2' in this case) allocated, and are put in the selective FF list, as shown in FIG. 7B, to be added to other FF's (none in this case) waiting therein to be taken out.

Then, at a step S22, the selective FF list is checked if it is vacant. As it is not vacant in this case, the result of check at step S22 is "NO", and the flow again goes to the step S14, where FF2 is taken out from the selective FF list. Allocated number to the taken FF2 is 2 and checked to be equal to n (=2) at the step S16, so that the flow goes to a step S18, where the taken FF2 is replaced by a scan FF and relabelled with an allocated number '0'.

Figure 7C:
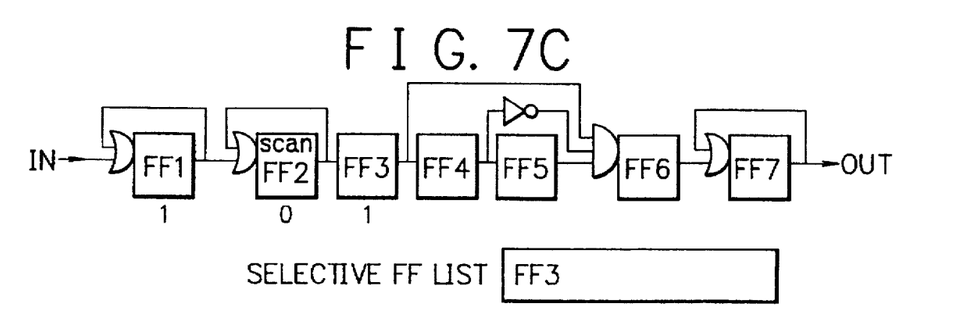
Figure 7D:
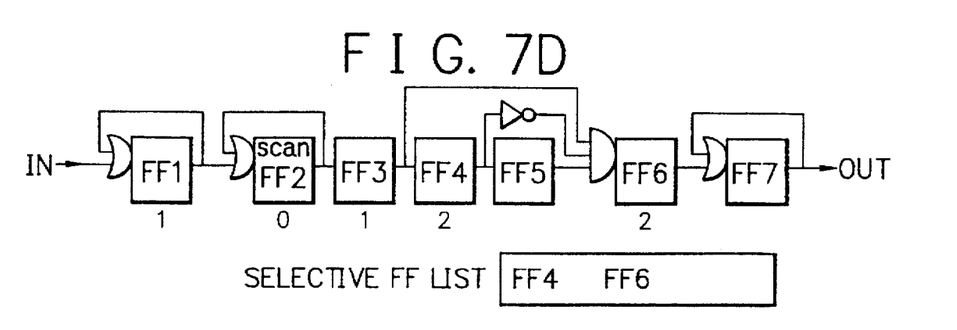

At the step S20, among connected FF's to FF2 in this turn of execution, i.e. between FF1 already numbered and FF3 in this case, the remaining FF3 without allocated number is labelled with a one-incremented number '1' allocated, and put in the selective FF list, as shown in FIG. 7C. Hence, the list is not vacant at the step S22, the flow again goes to the step S14, where FF3 is taken out from the list. Because of the allocated number '1' to FF3, the result of check at the step S16 is "NO", so that the step S20 is executed. In this turn, among connected FF's to FF3, remaining ones without allocated numbers are FF4 and FF6, which are therefore labelled with an allocated number '2' and put in the selective FF list, as shown in FIG. 7D.

Figure 8A:
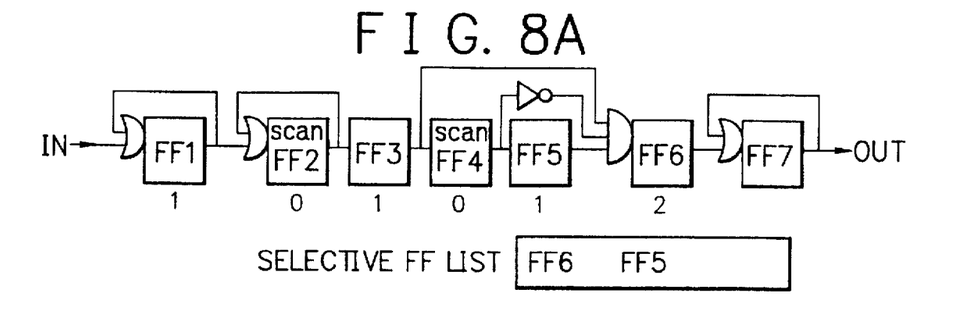
FIGS. 8A to 8D are circuit diagrams for describing another series of steps of the design procedure according to the flowchart of FIG. 6, respectively.
Figure 8B:
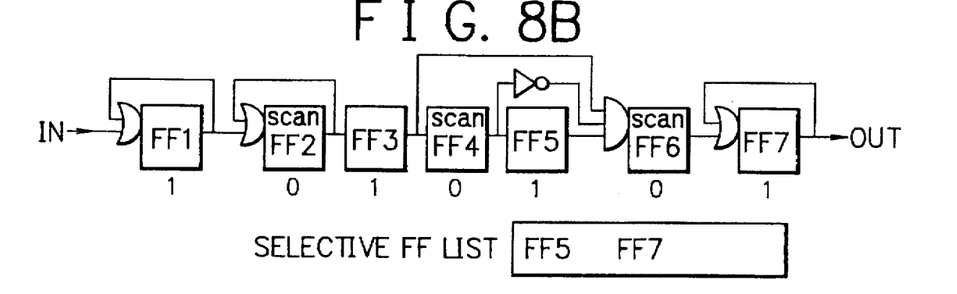

In a subsequent turn of execution at the step S14, FF4 is taken out from the selective FF list. Because of an allocated number '2' to FF4 at the step S16, FF4 at the step S18 is replaced by a scan FF and relabelled with an allocated number '0'. Then, at the step S20, FF5 is labelled with an allocated number '1' and put in the selective FF list, as shown in FIG. 8A. As the list is not vacant, the flow again goes to the step S14, where FF6 is now taken out from the list. Still because of an allocated number '2' to FF6 at the step S16, FF6 at the step S18 also is replaced by a scan FF and relabelled with an allocated number '0'. Then, at the step S20, FF7 is labelled with an allocated number '1' and put in the selective FF list, as shown in FIG. 8B.

Figure 8C:
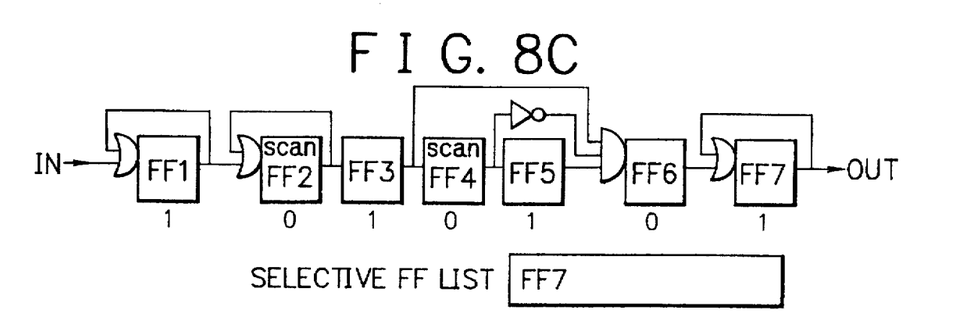
Figure 8D:
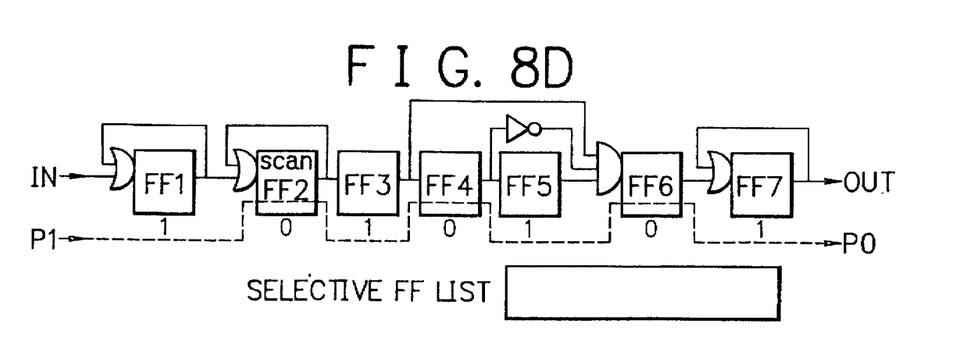

In the check at the step S22 in this turn also, the selective FF list is yet not vacant, so that the flow goes to the step S14, where FF5 is taken out from the list. FF5 has an allocated number '1' (at the step S16) and no flip-flop remains without allocated number and hence is put in the selective FF list (at the step S20), FF7 is now left alone in the list (at the step S22), as shown in FIG. 8C. The last flip-flop FF7 also is taken out from the list at the step S14. Further, still FF7 has an allocated number '1' (at the step S16) and no flip-flop remains without allocated number and hence is put in the selective FF list (at the step S20), the list is vacant (at the step S22). Therefore, the flow goes to a step S24, where scan test wiring is given as shown in FIG. 8D. so that the design procedure is completed at an end step S26.

Figure 9A:
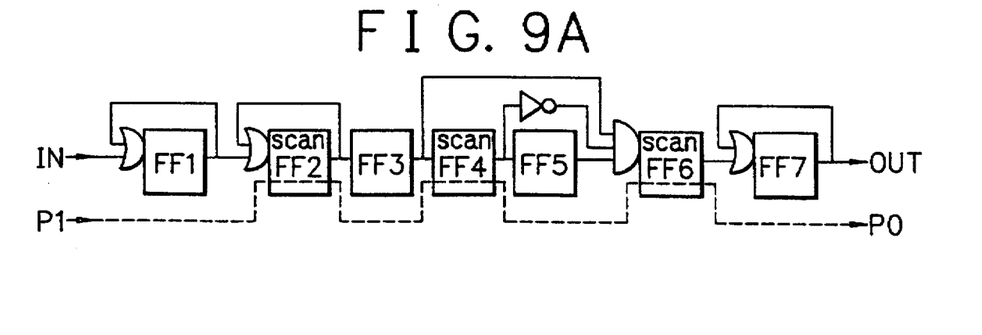
FIGS. 9A to 9D are circuit diagrams of the integrated semiconductor circuit according to the first embodiment, respectively.

FIG. 9A shows a circuit diagram of the integrated semiconductor circuit thus designed. There will be described below a testing method of that circuit, with reference to FIGS. 9A–9D.

Figure 9B:
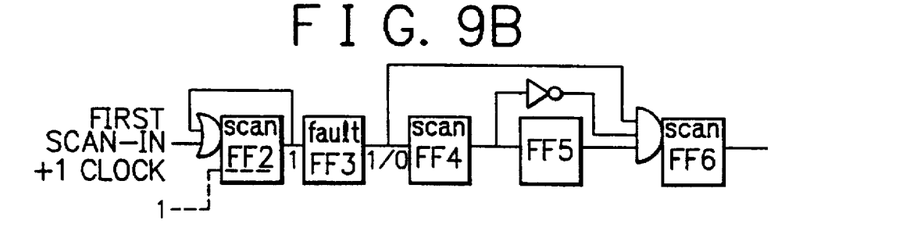

A trouble is now supposed to have occurred such that, in FIG. 9B, FF3 fails to vary the output, constantly giving a "0". For detection of the trouble, firstly a data value "1" is scanned into the scan FF2, rendering the operation mode thereof normal, to operate thereunder by one clock, to thereby transmit value "1" of the scan FF2 to the faulty FF3, though the faulty FF3 fails to normally take in the value "1".

Then, under a test mode, an erroneous data value "0" of FF3 that properly or normally would be "1" is taken into the scan FF4. The erroneous value now can be observed by performing a scan-out action. Likewise, also of FF1 and FF7 in FIG. 9A, the trouble can be observed by once performing a scan-in action and a scan-out action, although for FF1 an input terminal IN should be employed for data input under a normal operation mode.

Figure 9C:
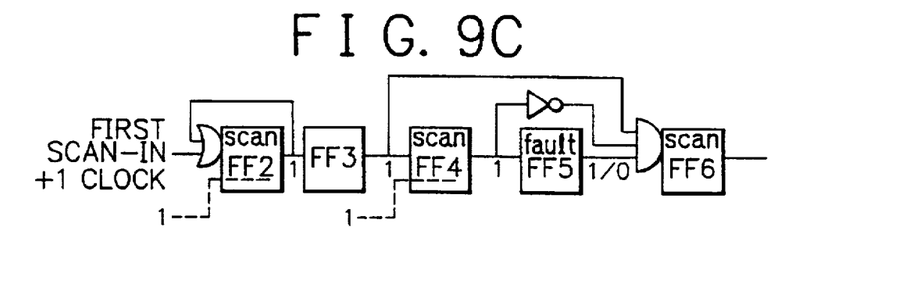
Figure 9D:
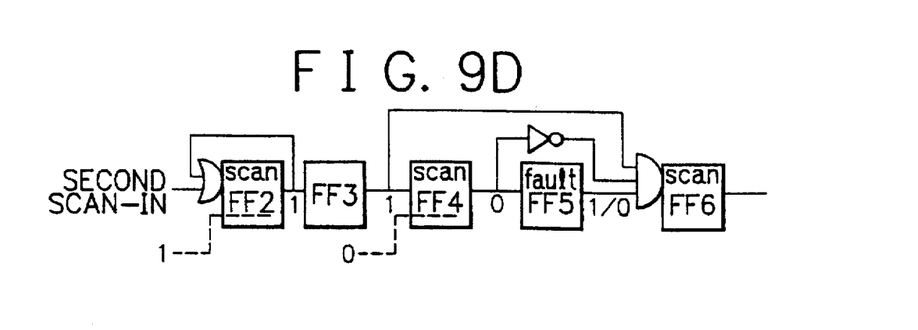

In the case of trouble detection of FF5, however, a scan-in action is required to be performed twice. FF5 is now supposed to be failing to vary the output, constantly giving a "0". For detection of the trouble, a data value "1" is scanned in to both scan FF2 and scan FF4, rendering the operation mode normal, as shown in FIG. 9C. This action causes the faulty FF5 to output an erroneous value "0" in place of correct value "1". But the value of scan FF4 is "1", and hence the scan FF6 gives a value "0" irrespective of the output of faulty FF5, thus rendering the trouble detection disabled. Therefore, another scan-in action is performed to scan in a data value "0" to the scan FF4, as shown in FIG. 9D. Then, under thus obtained status, a scan-out action is performed, so that the output of scan FF6 that normally would be "1" appears "0", thus permitting the trouble detection of FF5 to be made.

In the present embodiment of the invention, which has scan FF's placed at intervals of one FF, a scan-in action is performed only once or twice to achieve an effective trouble detection of FF, thus needing no more than three or six clocks in total. Moreover, the necessary number of scan-in actions does not exceed the preset numeral n.

Figure 10:
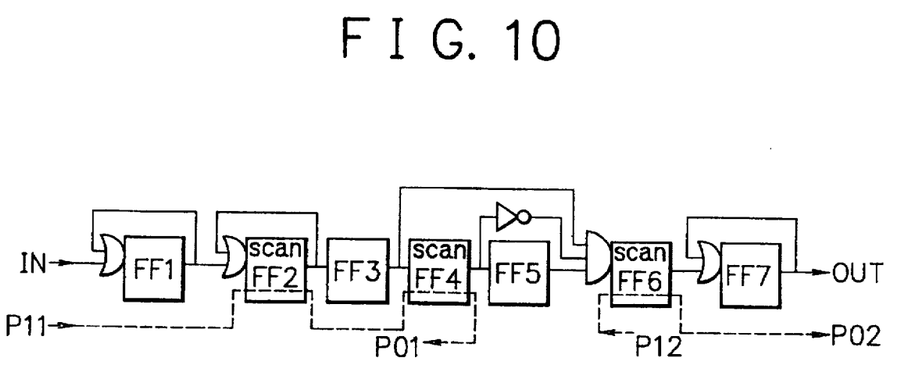
FIG. 10 is a circuit diagram of an integrated semiconductor circuit according to a second embodiment of the invention.

FIG. 10 shows a circuit diagram according to a second embodiment of the invention, which is commonly applicable to a multi-scan system also. In the first embodiment, a single scan path is provided, so that three clocks are required to once perform a scan-in action and a scan-out action, respectively. To this point, the second embodiment needs no more than two clocks. It therefore needs no more than two or four clocks in total employed to perform a necessary number of scan-in actions for trouble detection.

As apparent from the foregoing description of the preferred embodiments, according to the subject matter of the present invention, in an integrated semiconductor circuit and a testing method thereof, flip-flops are constituted as a scan flip-flop at regular intervals, and are adapted to perform a scan-in action and a scan-out action in a scan test. To a scan flip-flop of an integrated semiconductor circuit so constituted a scan-in action is performed, and a normal operation to the integrated semiconductor circuit is executed with a number of clock cycles not exceeding a predetermined number of flip-flops, and then a scan-out action is performed to the scan flip-flop. Following such a procedure, a scan-in action is performed for a predetermined logic, and scanned out logic data are checked, thereby permitting a certain flip-flop to be effectively judged to be good or not.

According to the present invention, therefore, the necessary number of scan flip-flops for a scan test is substantially reduced to a half or smaller when compared with the case of a typical conventional scan system or of a multi-scan system, thus effectively keeping the chip area from being increased with the number of scan flip-flops. Moreover, the necessary number of clocks for a single scan-in action is reduced to a half or smaller of the total number of flip-flops, and the required number of scan-in actions to once perform a scan test also is reduced, thus effectively achieving a shorter test time.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An integrated semiconductor circuit comprising:
   a circuit network connected between a logical data input terminal and a processed data output terminal, the circuit network comprising:
      a combinational logic comprising at least one logic device; and
      a set of flip-flops, connected to said at least one logic device, comprising a subset of flip-flops and a total set of scan flip-flops, the total set of scan flip-flops including a first set of scan flip-flops;
   a first scan test wiring serially connecting said first set of scan flip-flops;
   a first test data input terminal, connected to said first scan test wiring, for inputting a first test data;
   a first test data output terminal, connected to said first scan test wiring, for outputting the first test data;

the circuit network being responsive to a normal operation mode signal for connecting the combinational logic and the set of flip-flops to the logical data input terminal and the processed data output terminal, to form a sequential circuit including a data processing route, wherein the total set of scan flip-flops is serially arranged along the data processing route in a data flow direction so that a predetermined number greater than zero of the flip-flops of the subset of flip-flops is positioned between adjacent ones of said scan flip-flops, the circuit network being responsive to a scan test mode signal to form a first sequence of shift registers for shifting the first test data, said circuit further comprising:

a second set of scan flip-flops of said total set of scan flip-flops;

a second scan test wiring for serially connecting the second set of scan flip-flops;

a second test data input terminal, connected to said second scan test wiring, for inputting a second test data;

a second test data output terminal, connected to said second scan test wiring, for outputting the second test data, wherein the data processing route is established so that said predetermined number of flip-flops of the subset of flip-flops is positioned between adjacent flip-flops of said second set of scan flip-flops;

wherein the circuit network is responsive to the scan test mode signal to form a second sequence of shift registers for shifting the second test data.

2. An integrated semiconductor circuit comprising:

a circuit network connected between a logical data input terminal and a processed data output terminal, the circuit network comprising:

a combinational logic comprising at least one logic device; and a set of flip-flops, connected to said at least one logic device, comprising a subset of flip-flops and a total set of scan flip-flops, the total set of scan flip-flops including a first set of scan flip-flops;

a first scan test wiring serially connecting said first set of scan flip-flops;

a first test data input terminal, connected to said first scan test wiring, for inputting a first test data; and a first test data output terminal, connected to said first scan test wiring, for outputting the first test data, the circuit network being responsive to a normal operation mode signal for connecting the combinational logic and the set of flip-flops to the logical data input terminal and the processed data output terminal, to form a sequential circuit including a data processing route, wherein the total set of scan flip-flops is serially arranged along the data processing route in a data flow direction so that a predetermined number greater than zero of the flip-flops of the subset of flip-flops is positioned between adjacent ones of said scan flip-flops, the circuit network being responsive to a scan test mode signal to form a first sequence of shift registers for shifting the first test data, wherein, during a test mode, a required number of scan-in actions does not exceed said predetermined number.

3. An integrated circuit comprising:

a circuit network connected between a logical data input terminal and a processed data output terminal, the circuit network comprising:

a combinational logic comprising at least one logic device; and a set of flip-flops, connected to said at least one logic device, comprising a subset of flip-flops and a total set of scan flip-flops, the total set of scan flip-flops including a first set of scan flip-flops;

a first scan test wiring serially connecting said first set of scan flip-flops;

a first test data input terminal, connected to said first scan test wiring, for inputting a first test data; and a first test data output terminal, connected to said first scan test wiring, for outputting the first test data, the circuit network being responsive to a normal operation mode signal for connecting the combinational logic and the set of flip-flops to the logical data input terminal and the processed data output terminal, to form a sequential circuit including a data processing route, wherein the total set of scan flip-flops is serially arranged along the data processing route in a data flow direction so that a predetermined number greater than zero of the flip-flops of the subset of flip-flops is positioned between adjacent ones of said scan flip-flops, the circuit network being responsive to a scan test mode signal to form a first sequence of shift registers for shifting the first test data, wherein said serially connected first set of scan flip-flops are positioned at regular intervals between said subset of flip-flops along said data processing route such that said data processing route is branchable.

4. An integrated circuit having test circuitry comprising:

a plurality of flip-flops including a first flip-flop and a last flip-flop;

a logical input connected to said first flip-flop;

a logical output connected to said last flip-flop;

a plurality of logical elements connected to respective ones of said flip-flops; and a plurality of scan flip-flops, each connected to at least one of said flip-flops, wherein said logical input, said flip-flops, said scan flip-flops, said logical elements and said logical output, in combination, comprise logical circuitry, wherein said scan flip-flops comprise said test circuitry and a predetermined number greater than zero of said flip-flops are positioned between adjacent ones of said scan flip-flops, wherein said scan flip-flops are serially connected, wherein during a normal operation mode, said flip-flops and said scan flip-flops both operate in a first manner, wherein, during a test mode said flip-flops operate in said first manner and said scan flip-flops operate in a second manner, and wherein said scan flip-flops, in combination, form a shift register for shifting test data into said logic circuitry.

5. An integrated circuit having test circuitry comprising:

a plurality of flip-flops including a first flip-flop and a last flip-flop;

a logical input connected to said first flip-flop;

a logical output connected to said last flip-flop;

a plurality of logical elements connected to respective ones of said flip-flops; and a plurality of scan flip-flops, each connected to at least one of said flip-flops, wherein said logical input, said flip-flops, said scan flip-flops, said logical elements and said logical output, in combination, comprise logical circuitry, wherein said scan flip-flops form said test circuitry and a predetermined number greater than zero of said flip-flops are positioned between adjacent ones of said scan flip-flops, and wherein said scan flip-flops include first scan flip-flops and second scan flip-flops, said first scan flip-flops being serially connected and said second scan flip-flops being separately serially connected.

6. An integrated circuit as in claim 5, wherein said first scan flip-flops, in combination, form a first shift register and said second flip-flops, in combination, form a second shift register, said first shift register and said second shift register for shifting test data into said logic circuitry.

7. An integrated circuit as in claim 5, wherein said first scan flip-flops include an initial first scan flip-flop and a last first scan flip-flop, said second flip-flops including an initial second flip-flop and a last second flip-flop, said integrated circuit further comprising a first test data input connected to said initial first scan flip-flop and a first test data output connected to said last first scan flip-flop, and said integrated circuit further comprising a second test data input connected to said initial second scan flip-flop and a second test data output connected to said last second scan flip-flop.

8. An integrated circuit having test circuitry, comprising:

a plurality of flip-flops including a first flip-flop and a last flip-flop;

a logical input connected to said first flip-flop;

a logical output connected to said last flip-flop;

a plurality of logical elements connected to respective ones of said flip-flops; and a plurality of scan flip-flops, each connected to at least one of said flip-flops, wherein said logical input, said flip-flops, said scan flip-flops, said logical elements and said logical output, in combination, comprise logical circuitry, wherein said scan flip-flops comprise said test circuitry and a predetermined number greater than zero of said flip-flops are positioned between adjacent ones of said scan flip-flops, and wherein, during a test mode, a required number of scan-in actions does not exceed said predetermined number.

9. An integrated circuit having test circuitry formed by the process comprising steps of:

forming a series of flip-flops connected to logical elements;

setting an interval value;

selecting a flip-flop of said series of flip-flops to obtain a selected flip-flop;

allocating a first value to said selected flip-flop;

comparing said interval value to said first value;

replacing said selected flip-flop with a scan flip-flop if said first value corresponds to said interval value;

determining all flip-flops which are connected to said scan flip-flop;

selecting said all flip-flops connected to said scan flip-flop and deselecting said scan flip-flop;

resetting said first value if said first value corresponds to said interval value;

incrementing said first value if said first value does not correspond to said interval value;

repeating all of said allocating, comparing, replacing, determining, selecting all, resetting and incrementing steps for each of said series flip-flops.

10. An integrated circuit having test circuitry formed by the process of claim 9, wherein said interval value is two.

11. An integrated circuit having test circuitry formed by the process of claim 9, further comprising a step of forming connections between scan flip-flops.

12. An integrated circuit having test circuitry formed by the process of claim 9, further comprising a step of forming a plurality of connections between scan flip-flops so as to form a plurality of sets of scan flip-flops.

13. An integrated circuit having test circuitry formed by the process of claim 9, further comprising a step of testing said circuit, said testing step comprising steps of:

inputting a test mode signal to scan flip-flops;

scanning in a first signal into said scan flip-flops;

operating said integrated circuit for one clock cycle;

outputting a test value from said scan flip-flops;

repeating said scanning, operating and outputting steps a predetermined number of times, wherein said predetermined number does not exceed said interval value.

* * * * *

UNITED STATES PATENT AND TRADEMARK OFFICE
CERTIFICATE OF CORRECTION

PATENT NO. : 5,680,406
DATED : October 21, 1997
INVENTOR(S) : Yoshiyuki Nakamura It is certified that error appears in the above-identified patent and that said Letters Patent is hereby corrected as shown below:

On the title page , please correct Foreign Application Priority Data as follows:
change " Jul. 2, 1993 " to -- September 2, 1993 --.

Signed and Sealed this

Fourteenth Day of April, 1998

Attest:

BRUCE LEHMAN

Attesting Officer

Commissioner of Patents and Trademarks